United States Patent
Lin

(10) Patent No.: US 9,854,666 B2
(45) Date of Patent: Dec. 26, 2017

(54) PRINTED CIRCUIT BOARD WITH A DIFFERENTIAL LINE PAIR HAVING VIAS IN EACH LINE THAT ARE NOT EQUALLY SPACED APART

(71) Applicant: HON HAI PRECISION INDUSTRY CO., LTD, New Taipei (TW)

(72) Inventor: Yu-Hsu Lin, Santa Clara, CA (US)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 70 days.

(21) Appl. No.: 14/921,170

(22) Filed: Oct. 23, 2015

(65) Prior Publication Data
US 2017/0105281 A1   Apr. 13, 2017

(30) Foreign Application Priority Data
Oct. 9, 2015  (CN) .......................... 2015 1 0648809

(51) Int. Cl.
*H05K 1/02* (2006.01)
(52) U.S. Cl.
CPC ......... *H05K 1/0245* (2013.01); *H05K 1/0251* (2013.01)

(58) Field of Classification Search
CPC .. H05K 1/0245; H05K 1/0248; H05K 1/0251; H01P 3/04
USPC .......................................................... 333/4, 5
See application file for complete search history.

(56) References Cited

U.S. PATENT DOCUMENTS

| | | | |
|---|---|---|---|
| 2007/0130555 A1* | 6/2007 | Osaka ............... | H01L 23/49838 439/14 |
| 2012/0243184 A1* | 9/2012 | Lee ...................... | H05K 1/0245 361/737 |

* cited by examiner

*Primary Examiner* — Benny Lee
(74) *Attorney, Agent, or Firm* — ScienBiziP, P.C.

(57) ABSTRACT

A printed circuit board includes a differential pair of transmission lines. The differential pair of transmission lines includes a first signal transmission line and a second signal transmission line. The first signal transmission line includes a first via and a second via. The second transmission line includes a third via and a fourth via. A first distance between a center of the first via and a center of the third via is equal to a first value. A second distance between a center of the second via and a center of the fourth via is equal to the first value. A third distance between the center of the first via and the center of the second via is equal to a second value. A fourth distance between the center of the third via and the center of the fourth via is not equal to the second value.

5 Claims, 2 Drawing Sheets

PRINTED CIRCUIT BOARD WITH A DIFFERENTIAL LINE PAIR HAVING VIAS IN EACH LINE THAT ARE NOT EQUALLY SPACED APART

FIELD

The subject matter herein generally relates to a printed circuit board.

BACKGROUND

Many factors, such as the parameters of the electrical elements or the PCB and the layout of the PCB, can affect the signal integrity, or lead to instability of the system, possibly even causing the system to breakdown.

BRIEF DESCRIPTION OF THE DRAWINGS

Implementations of the present technology will now be described, by way of example only, with reference to the attached figures.

DETAILED DESCRIPTION

Figure 1:
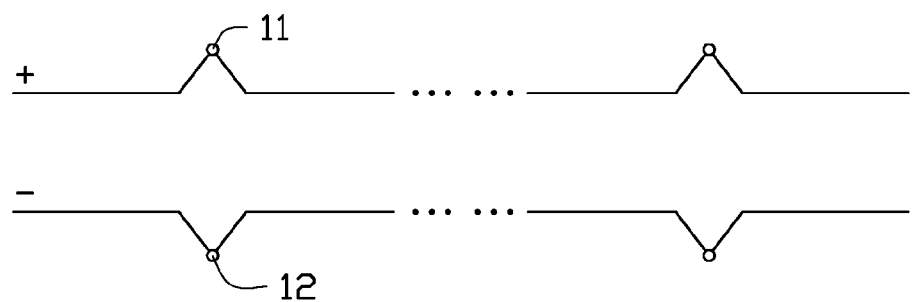
FIG. 1 is a top view of a typical related art 4-layers printed circuit board with a differential pair having two mutually symmetrical vias.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently coupled or releasably coupled. The term "comprising," when utilized, means "including, but not necessarily limited to"; it specifically indicates open-ended inclusion or membership in the so-described combination, group, series and the like.

The disclosure will now be described in relation to a printed circuit board with a differential pair having two mutually dissymmetrical vias.

FIG. 1 shows a typical related art 4-layers printed circuit board with a differential pair with positive (+) signal lines and negative (−) signal lines having two mutually symmetrical vias. A line located between a center of a via 11 and a center of a via 12 is perpendicular to both of transmission lines of the differential pair. The above design needs more space on the printed circuit board and has low signal integrity.

Figure 2:
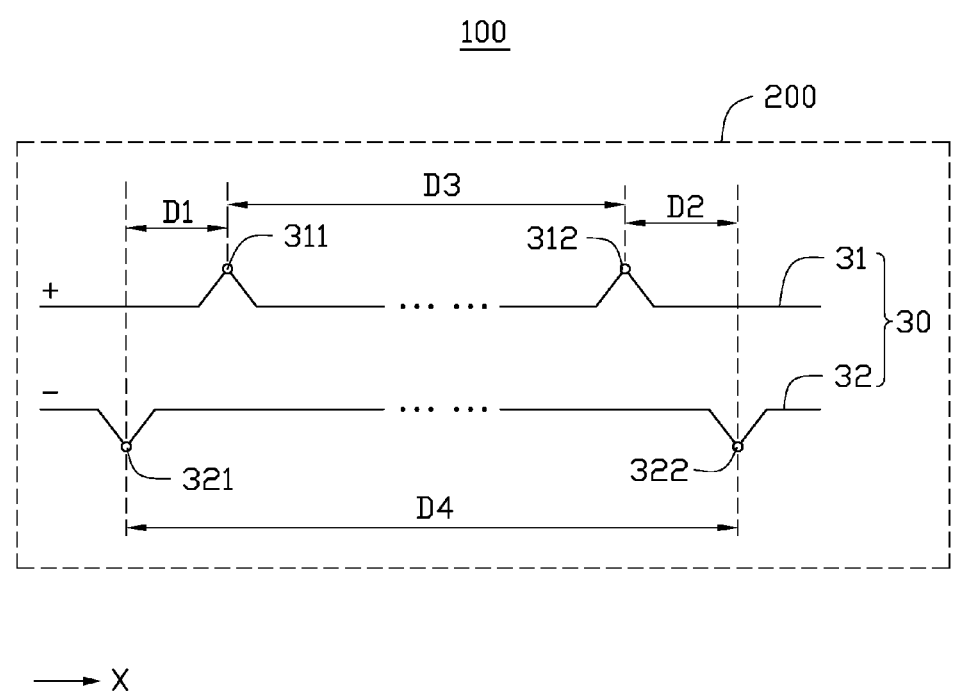
FIG. 2 is a top view of an embodiment of a printed circuit board with a differential pair having two mutually dissymmetrical vias of the present disclosure.

FIG. 2 shows an embodiment of a printed circuit board 100 of the present disclosure. The printed circuit board 100 can comprise a signal layer 200. A differential pair 30 is set on the surface of the signal layer 200.

The differential pair 30 can comprise a first signal transmission line 31 and a second signal transmission line 32. The first signal transmission line 31 can comprise a first via 311 and a second via 312. The second signal transmission line 32 can comprise a third via 321 and a fourth via 322.

A first distance D1 between a center of the first via 311 and a center of the third via 321 is equal to a first value S1. The extending direction of the first signal transmission line 31 is parallel to an X direction. The first distance D1 is defined between the first via 311 and the third via 321 along the direction X. A second distance D2 between a center of the second via 312 and a center of the fourth via 322 is equal to the first value S1. The second distance D2 is defined between the second via 312 and the fourth via 322 along the direction X. The first value S1 is greater than zero. A third distance D3 between the center of the first via 311 and the center of the second via 312 is equal to a second value S2. The third distance D3 is defined between the first via 311 and the second via 312 along the direction X. A fourth distance D4 between the center of the third via 321 and the center of the fourth via 322 is not equal to the second value S2. The fourth distance D4 is defined between the third via 321 and the fourth via 322 along the direction X. In at least one embodiment, the first signal transmission line 31 is a positive (+) signal transmission line and the second signal transmission line 32 is a negative (−) signal transmission line.

In at least one embodiment, the first via 311 is coupled to the second via 311 through a part of the first signal transmission line 31. The third via 321 is coupled to the fourth via 322 through a part of the second signal transmission line 32.

In at least one embodiment, the first value S1=(T*V)/2. T is a rise time of a signal of the differential pair 30. V is a transmission speed value of the signal of differential pair 30.

In at least one embodiment, a result of the fourth distance D4 minus the third distance D3 is equal to twice the value of S1. Thus, the value of S1 satisfies a formula as below: D4D3=2*S1=T*V.

In other embodiments, a result of the third distance D3 minus the fourth distance D4 is equal to twice the value of S1.

The present disclosure is not limited to be employed by the 4-layers PCB, and can be used by another PCB, such as a 6-layers PCB, or an 8-layers PCB.

While the disclosure has been described by way of example and in terms of the embodiment, it is to be understood that the disclosure is not limited thereto. On the contrary, it is intended to cover various modifications and similar arrangements as would be apparent to those skilled in the art. Therefore, the range of the appended claims should be accorded the broadest interpretation so as to encompass all such modifications and similar arrangements.

What is claimed is:
1. A printed circuit board comprising:
   a differential pair of transmission lines comprising:
      a first signal transmission line comprising a first via and a second via; and
      a second signal transmission line comprising a third via and a fourth via;

a first distance between a center of the first via and a center of the third via is equal to a first value;

a second distance between a center of the second via and a center of the fourth via is equal to the first value;

a third distance between the center of the first via and the center of the second via is equal to a second value; and a fourth distance between the center of the third via and the center of the fourth via is not equal to the second value;

wherein a first line located at the first via is substantially perpendicular to the first signal transmission line, a second line located at the third via is substantially perpendicular to the first signal transmission line, the first distance is defined between the first line and the second line, and the first value is greater than zero; and wherein the first value is equal to $(T*V)/2$, T is a rise time of a signal of the differential pair, and V is a transmission speed value of the signal of the differential pair.

2. The printed circuit board as claim 1, wherein the first via is coupled to the second via through a part of the first signal transmission line, the third via is coupled to the fourth via through a part of the second signal transmission line.

3. The printed circuit board as claim 1, wherein the differential pair is set on a signal layer of the printed circuit board.

4. The printed circuit board as claim 1, wherein a result of the fourth distance minus the third distance is equal to twice of the first value.

5. The printed circuit board as claim 1, wherein a result of the third distance minus the fourth distance is equal to twice of the first value.

* * * * *